US008296691B2

(12) United States Patent
Chidambarrao et al.

(10) Patent No.: US 8,296,691 B2
(45) Date of Patent: *Oct. 23, 2012

(54) METHODOLOGY FOR IMPROVING DEVICE PERFORMANCE PREDICTION FROM EFFECTS OF ACTIVE AREA CORNER ROUNDING

(75) Inventors: Dureseti Chidambarrao, Weston, CT (US); Gerald M. Davidson, Essex Junction, VT (US); Paul A. Hyde, Essex Junction, VT (US); Judith H. McCullen, Essex Junction, VT (US); Shreesh Narasimha, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 639 days.

This patent is subject to a terminal disclaimer.

(21) Appl. No.: 11/971,015

(22) Filed: Jan. 8, 2008

(65) Prior Publication Data
US 2009/0178012 A1    Jul. 9, 2009

(51) Int. Cl.
*G06F 17/50* (2006.01)
*G06F 9/45* (2006.01)
*G06G 7/48* (2006.01)

(52) U.S. Cl. .......... 716/101; 716/50; 716/100; 716/104; 716/106; 716/132; 703/4; 703/13; 703/15

(58) Field of Classification Search .................. 716/2, 4, 716/5, 8, 19; 703/4, 13, 15
See application file for complete search history.

(56) References Cited

U.S. PATENT DOCUMENTS

| 6,246,973 | B1 * | 6/2001 | Sekine ............................. 703/4 |
| 7,337,420 | B2 * | 2/2008 | Chidambarrao et al. ......... 716/8 |
| 2005/0251771 | A1 * | 11/2005 | Robles .............................. 716/5 |
| 2006/0273266 | A1 * | 12/2006 | Preil et al. ..................... 250/548 |
| 2007/0291828 | A1 * | 12/2007 | Martin et al. ................. 375/219 |

(Continued)

OTHER PUBLICATIONS

Liebmann, et al., "Reducing DfM to Practice: the Lithography Manufacturability Assessor", Design and Process Integration for Microelectronic Manufacturing IV, Proc. of SPIE, vol. 6156, 61560K (2006).

(Continued)

*Primary Examiner* — Helen Rossoshek
(74) *Attorney, Agent, or Firm* — Scully, Scott, Murphy & Presser, P.C.; Joseph P. Abate, Esq.

(57) ABSTRACT

A system and method for modeling a semiconductor transistor device structure having a conductive line feature of a designed length connected to a gate of a transistor device in a circuit to be modeled, the transistor including an active device (RX) area over which the gate is formed and over which the conductive line feature extends. The method includes providing an analytical model representation including a function for modeling a lithographic flare effect impacting the active device area width; and, from the modeling function, relating an effective change in active device area width (deltaW adder) as a function of a distance from a defined edge of the RX area. Then, transistor model parameter values in a transistor compact model for the device are updated to include deltaW adder values to be added to a built-in deltaW value. A netlist used in a simulation includes the deltaW adder values to more accurately describe the characteristics of the transistor device being modeled including modeling of lithographic corner rounding effect on transistor device parametrics.

24 Claims, 4 Drawing Sheets

U.S. PATENT DOCUMENTS

2008/0104550 A1* 5/2008 Sultan et al. .................. 716/2
2009/0108305 A1* 4/2009 Riviere-Cazaux et al. ... 257/288
2009/0160027 A1* 6/2009 Park et al. .................... 257/618
2009/0177448 A1* 7/2009 Chidambarrao et al. ......... 703/2
2009/0222785 A1* 9/2009 Cheng et al. ................. 716/19

OTHER PUBLICATIONS

Hyde, Paul, Release of Transistor Model SO112S0 and other information in "Declaration," (including Exhibit A), Dec. 19, 2011, 7 pages.

* cited by examiner

US 8,296,691 B2

METHODOLOGY FOR IMPROVING DEVICE PERFORMANCE PREDICTION FROM EFFECTS OF ACTIVE AREA CORNER ROUNDING

BACKGROUND OF THE INVENTION

1. Field of the Invention

The present invention relates to a novel method and system for optimizing integrated circuit layouts, generally, and particularly, a system and method for modeling performance of a semiconductor device structure for achieving modified ground rules for lithographic feature distances that optimize semiconductor device performance.

2. Description of the Prior Art

Lithographic constraints are important factors in determining the efficiency of a circuit layout. In essence, lithographic constraints are conventionally determined by the generally limited capability of a lithographic process to successfully print line features at specified positions within tolerances. A lithographic process involves using a lithographic exposure tool to illuminate a lithographic mask from a range of directions, and focusing a projected image of the mask onto a photosensitive film that coats a partially fabricated integrated circuit on a wafer, such as a silicon wafer. Lithographic process window represents the range of delivered light energy (dose) and image plane defocus within which the projected image adequately represents the desired circuit shapes. After the image is formed, the photosensitive film is developed, and the printed pattern is transferred into a functional process layer in the circuit. The final circuit then consists of many such patterned levels stacked atop one another.

FIG. 1A shows an example portion of a semiconductor device structure 10, e.g., including a FET device such as a pFET, suitable for characterizing a lithographic process impact on device performance. This device structure 10 includes an active device area (alternately referred to as "RX") 15 having an L shape, where the narrower width dimension "W" is formed on a semiconductor substrate and comprises, for example, a polysilicon gate or gate stack 25 (not shown) that separates source and drain regions each represented by contacts 29 and 29'. As shown in FIG. 1A, the active device area is characterized as having a "flare" region 12. This "flared" region, in the example depiction of FIG. 1A, is caused by the need for joining two devices that have different widths W and W2 and a common source or drain 29. The second device comprises a second gate 25' with device width W2 with contacts 29 and 29" to the source and drain regions. The contact 29 is common to both devices with gates 25 and 25'. Upon lithographic processing of the active area 15, the corner 30 rounds and the device width W of gate 25 is changed. This is considered a width expansion and the impact of the process on device characteristics needs to be assessed.

In an alternate example, as depicted in FIG. 1B, a semiconductor device structure 10' includes two flared regions 12 and 12' are exemplified. The flared regions 12 and 12' have two corners 30 and 30' in FIG. 1B which round upon lithographic processing and change the device width W.

In each embodiment depicted in FIGS. 1A, 1B, the conductive wire or line layer 25 and 25' (alternately referred to as "PC") comprising a conductive material, for example, polysilicon, is electrically coupled to the gate (not shown) and extends at either side of the active device area 15. Further as shown in FIGS. 1A and 1B are formed source and drain contact metallurgy such as 29, 29', and 29" formed at either side of the conductive line layer 25 for providing electrical contact to the active devices as known in the art.

Moreover, as the width flaring resulting from the lithographic processes may impact the "true" device width, the Ion current data (transistor data) for that device will accordingly vary. That is, for the structures shown in the example flaring of circuitry 10 in FIGS. 1A, 1B, significant current variation will be evident in dependence upon the RX width. Therefore, it is the case that any compact modeling used needs to account for the device performance effect in the model. That is, in the migration to 45 nm CMOS fabrication processes, the compact model for devices needs device performance effect in model.

Acceptable tolerances for the printed shapes must yield successful circuit performance, and must also be readily maintained under typical process variations. However, lithographic capability for printing a given feature edge is dependent on other features in the same local region of the circuit layout, as is circuit functionality. Consequently, lithographic constraints should ideally be very dynamic, and potentially incorporate and take advantage of the particular configurational details of large numbers of different local circuit cases.

Generally, however, due to general and practical design reasons, lithographic constraints are usually provided in a highly simplified form, known in the technology as design rules or ground rules, with these rules determining a lithographic capability, in effect, an achievable lithographic process window, which is at least acceptable in the technology, and these rules are normally employed for the entire circuit layout.

Thus, in the migration to 45 nm CMOS fabrication processes, e.g., of the device structures shown in FIGS. 1A, 1B, there is a need for a ground rules at a point where device performance is negatively affected.

Moreover, it would be highly desirable to provide a method and system for more accurately modeling semiconductor device performance by taking into account the impact of lithographic corner rounding effects, such as those effects that impact the RX area of a semiconductor device.

SUMMARY OF THE INVENTION

The present invention provides a system and method that addresses the above and other issues by providing a computationally efficient technique that accurately accounts for the shrinking or increase of the size of device features in semiconductor devices.

In particular, the invention comprises a system and method to account for the effects of the lithographic processes employed and their impact in active device area widths, e.g., a transistor gate channel width, and model their impact on circuit performance. Such methods and algorithms are implemented for obtaining the appropriate functional approximations and in extraction algorithms to obtain the correct geometric parameters.

Thus, in accordance with one aspect of the invention, there is provided a system and method for modeling a semiconductor transistor device structure having a conductive line feature of a designed thickness and length connected to a gate of a transistor device, the transistor including an active device (RX) area over which the gate is formed and over which the conductive line feature extends, the method comprising the steps of:

providing an analytical model representation for the transistor device structure, the analytical model representation including a function for modeling a lithographic corner rounding flare effect impacting the active device area; and, from the modeling function, relating an effective change in active device area width (deltaW adder) as a function of a distance from a defined edge of the RX area; and, updating transistor model parameter values in a transistor compact model for the transistor device to include deltaW adder values to be added to a built-in deltaW value, wherein a netlist used in a simulation include the deltaW adder values to describe the characteristics of the transistor device, and thereby model lithographic corner rounding effect of said active device area on transistor device parametrics.

BRIEF DESCRIPTION OF THE DRAWINGS

Reference may now be made to the accompanying drawings in which.

DETAILED DESCRIPTION OF THE INVENTION

Figure 1A:
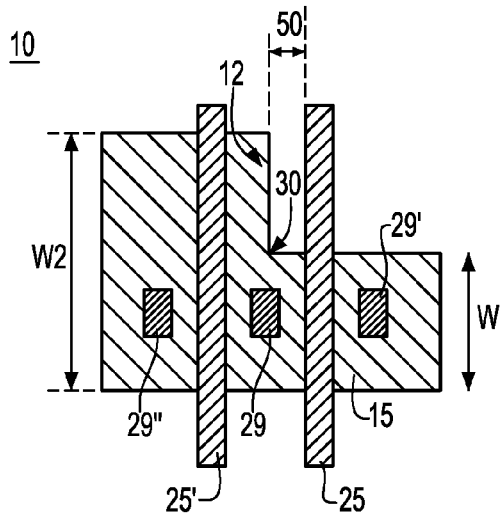
FIGS. 1A and 1B depict example device structures having a "flared" (rounded) corner region the features from which the compact model methodology for corner rounding effect impact on device performance is determined in an exemplary embodiment of the invention.
Figure 1B:
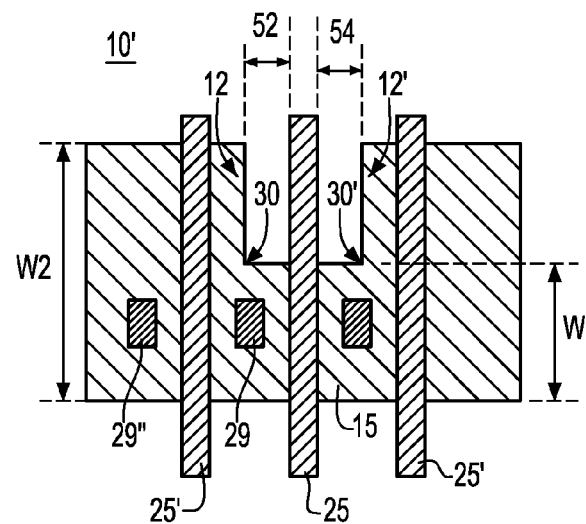
Figure 2:
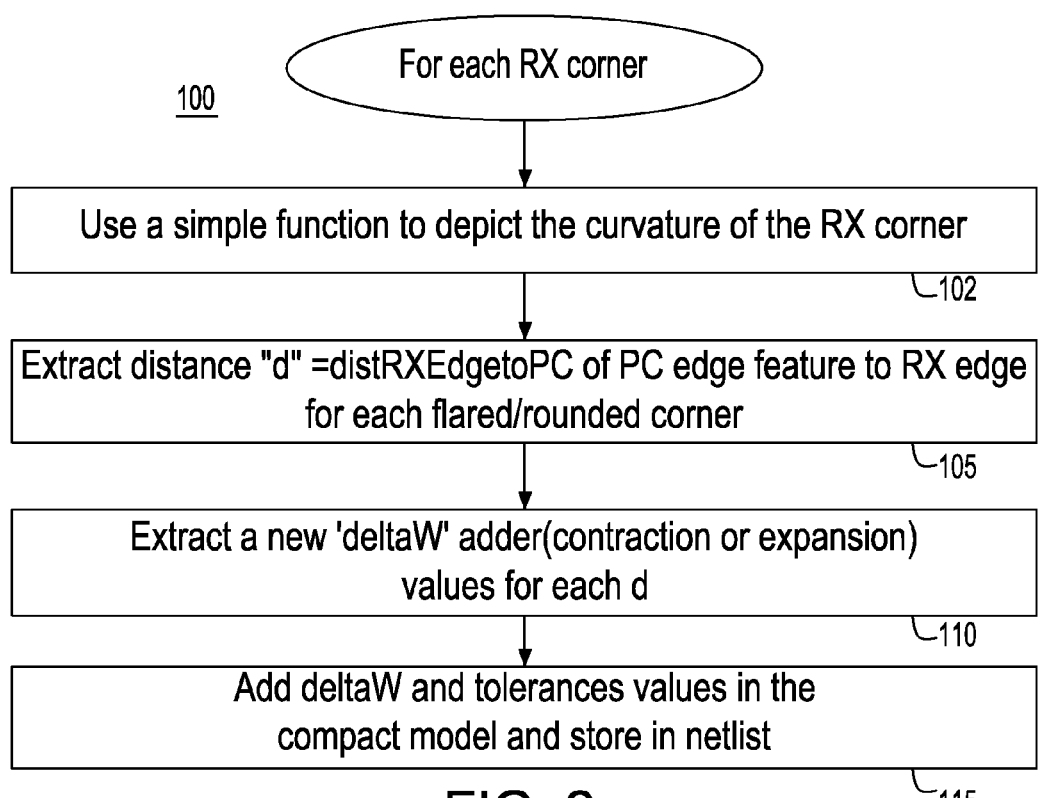
FIG. 2 depicts a methodology flow 100 according to one embodiment of the invention.

FIG. 2 depicts a methodology flow 100 according to one embodiment of the invention. It is understood that the method depicted will apply for each individual RX corner being modeled. In the method depicted, an analytical model is presented that includes a first step 102 that implements a simple function to depict the curvature of the flared RX corner region as shown in FIGS. 1A, 1B. In step 102, this model may be obtained by performing an RX lithographic contours analysis and from which an analytical model formulation with input choices based on the lithographic contours analysis is developed. In one embodiment, a contours analysis model is a geometric function, e.g., a circle, to determine the corner rounding description. In alternative embodiments, other geometric functions or combinations of functions (parabolas, triangles, etc.) may be used for the model; however, it has been determined that a circle function sufficiently fits the RX rounding effects, for example.

Figure 3:
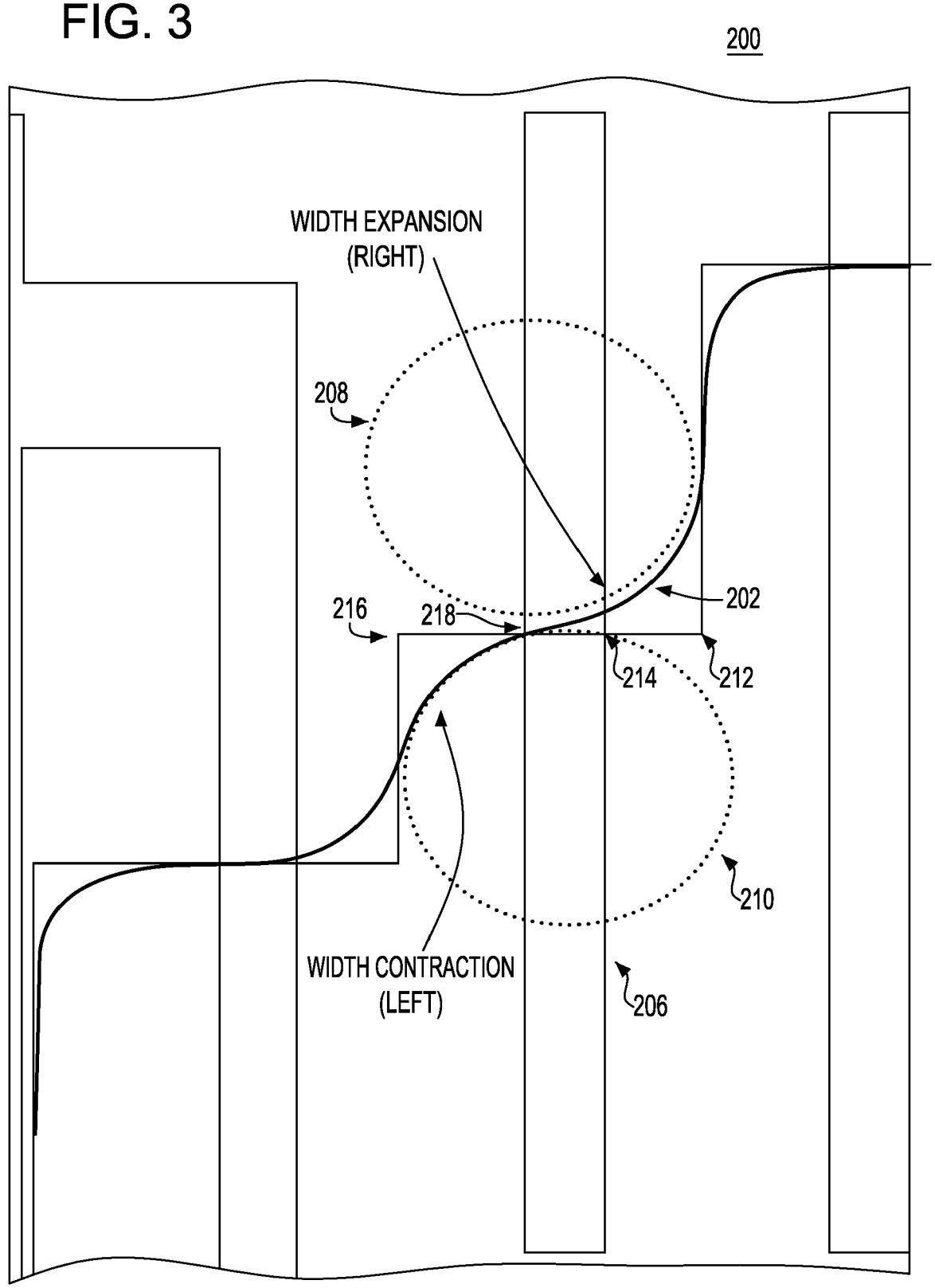
FIG. 3 depicts the results of implementing an example Optical Proximity Correction (OPC) technique that models how the RX lithographic contours may be used to determine RX rounding description at an example feature size for an example lithographic circuit structure 200.

Further to step 102, FIG. 2, there is depicted, in FIG. 3, the results of implementing an example Optical Proximity Correction (OPC) technique that models how the RX lithographic contours may be used to determine RX rounding/flaring description at an example feature size for a lithographic circuit structure. Particularly, as shown in FIG. 3, an LMA (Lithography Manufacturability Assessor, Liebmann, et al "Reducing DFM to practice: the lithographic manufacturability assessor", Proc SPIE V6156, pp. 178-189, 2006) tool (not shown) is used to determine, for an example device structure 200, the RX flare proximity effects such as a RX corner width expansion and width contraction to be used for the analytical model enhancements to be described. The designed RX active device area for the example device structure 200 flares to contour 202, for example, upon lithographic processing with one or more overlying PC (conductive line) features, e.g., conductive lines 206.

The actual resulting contour shapes 202 indicating the RX flaring depicted in FIG. 3 shows RX segments exhibiting width contraction and width expansion at either side (for left and right sides) of a PC feature 206 as compared to the intended RX area edge limits depicted by the drawn RX shape in structure 200. A circle is a reasonable approximation of the contour curve near the RX corners as seen in FIG. 3, however, other approximations can be used. Circle 208, for example, represents the width expansion part of contour 202 that is relevant from the right side of gate 206, while circle 210 represents the width contraction part of the contour 202 that is relevant from the left side of the gate 206. The appropriate width expansion equation in step 102 is then obtained from circle 208 using the distance between the points labeled 212 and 214 in FIG. 3 while for the width contraction the circle 210 with distance between points labeled 216 and 218 in FIG. 3 is used. Other functional forms besides a circle representing the contour curves characterizing the expansion and contraction parts is envisioned. Separate circle sizes for the expansion and contraction parts can implement the same equation as depicted at step 102 in flow chart 100 of FIG. 2. A simplifying embodiment is one where the radii of the expansion and contraction parts are the same.

Figure 4B:
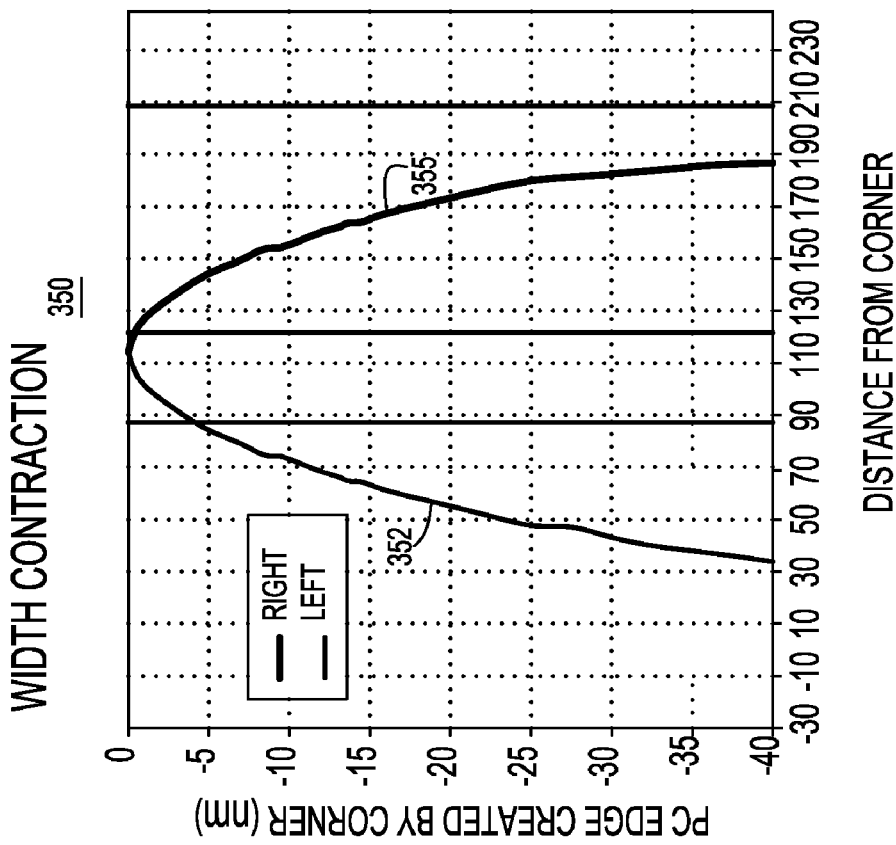
FIGS. 4A and 4B depict the modeling of the RX corner rounding effects for the expanded and contracted portions due to RX flaring with FIG. 4A showing the RX width expansion effect and FIG. 4B showing the width contraction effect; and, FIG. 5 depicts an example plot of deltaW adder equations that model the RX corner flare effects as represented by the extracted distances "d" embodied as the distRXEdgetoPC distances according to the methodology of the invention.
Figure 4A:
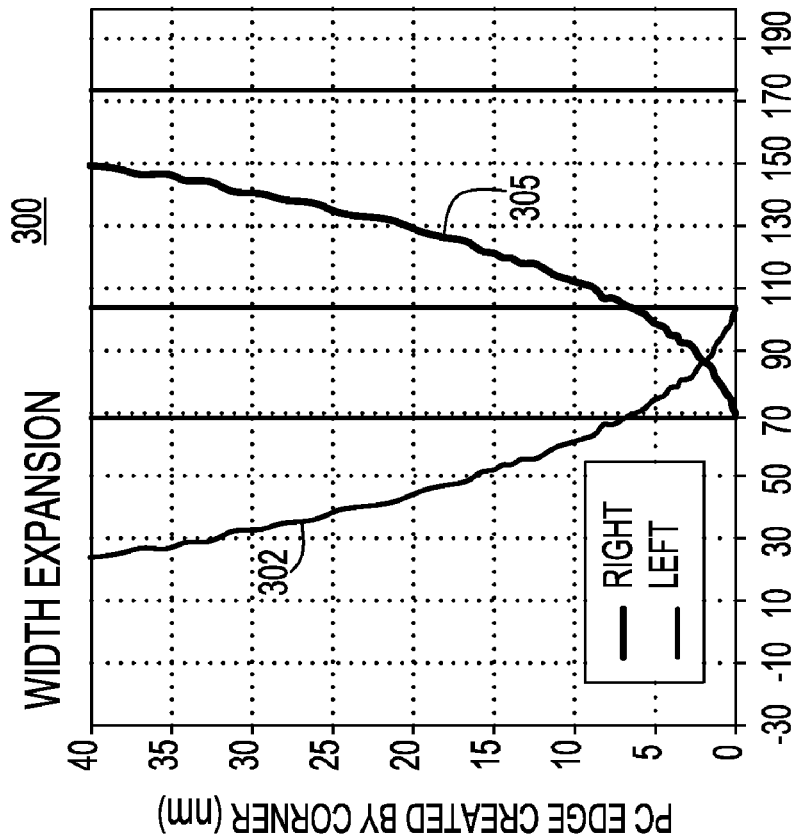

More particularly, as shown in FIG. 4A, the RX width expansion phenomena is shown as a plot 300 showing the effect of an RX corner creating a PC edge as a function of distance "d" or DistRXEdgetoPC. FIG. 4A shows the cases where width expansion occurs on either the left (302) or right (305) side of a PC. If the RX area is formed according to the structure 10' shown in FIG. 1B, then the RX corners are on both sides and the results would be summed for a combined expansion. Likewise, as shown in FIG. 4B, the RX width contraction phenomena is shown as a plot 350 showing the effect of an RX corner creating a PC edge as a function of distance "d" or DistRXEdgetoPC. FIG. 4B shows the cases where width contraction is happening on either the left (352) or right (355) side of a PC. If the RX corners are on both sides the results would be summed for a combined contraction. It is noted that width contraction is shown in a negative direction as indicated by the negative length units of the y-axis of the plot 350 in FIG. 4B. Referring back to FIG. 3, for gate 206 in the structure 200 depicted, when there is width contraction on one side and width expansion on the other side, the net impact on gate 206 is obtained by summing the negative contraction value and the positive expansion value.

Referring back to FIG. 2, there is depicted a next step 105 of extracting distances "d" between a PC edge to a respective RX edge flare effect, i.e., due to a flare effect causality. That is, using extraction tooling in one embodiment, a search is conducted to ascertain distances in both directions to determine the flare effects. Thus, distances "d" are extracted between PC edge feature to RX edge for each flared/rounded corner. Referring to the structure 10 shown in FIG. 1A, this extracted distance comprises a distance 50 between the RX edge and the PC feature edge for the case where a single flare effect is found. Likewise, referring to the structure shown in FIG. 1B, the extracted distances comprise a distance 52, 54 between a respective flared RX edge (in the case of expansion) and the PC feature edge for the case where the two flare effects are exhibited. From these distances, it will be ascertained how to model the deltaW increments or decrements based on the contours and the distances found.

Referring back to FIG. 2, there is depicted a next step 110 of generating equations from which deltaW adder values (contraction or expansion) are determined. Particularly, at step 110, the deltaW adder equations and tolerances are plotted in either tabular or equation form as a function of the distRXEdgetoPC values in a Dynamic Link Library DLL (e.g., C, TCL, Scheme or other code).

Figure 5:
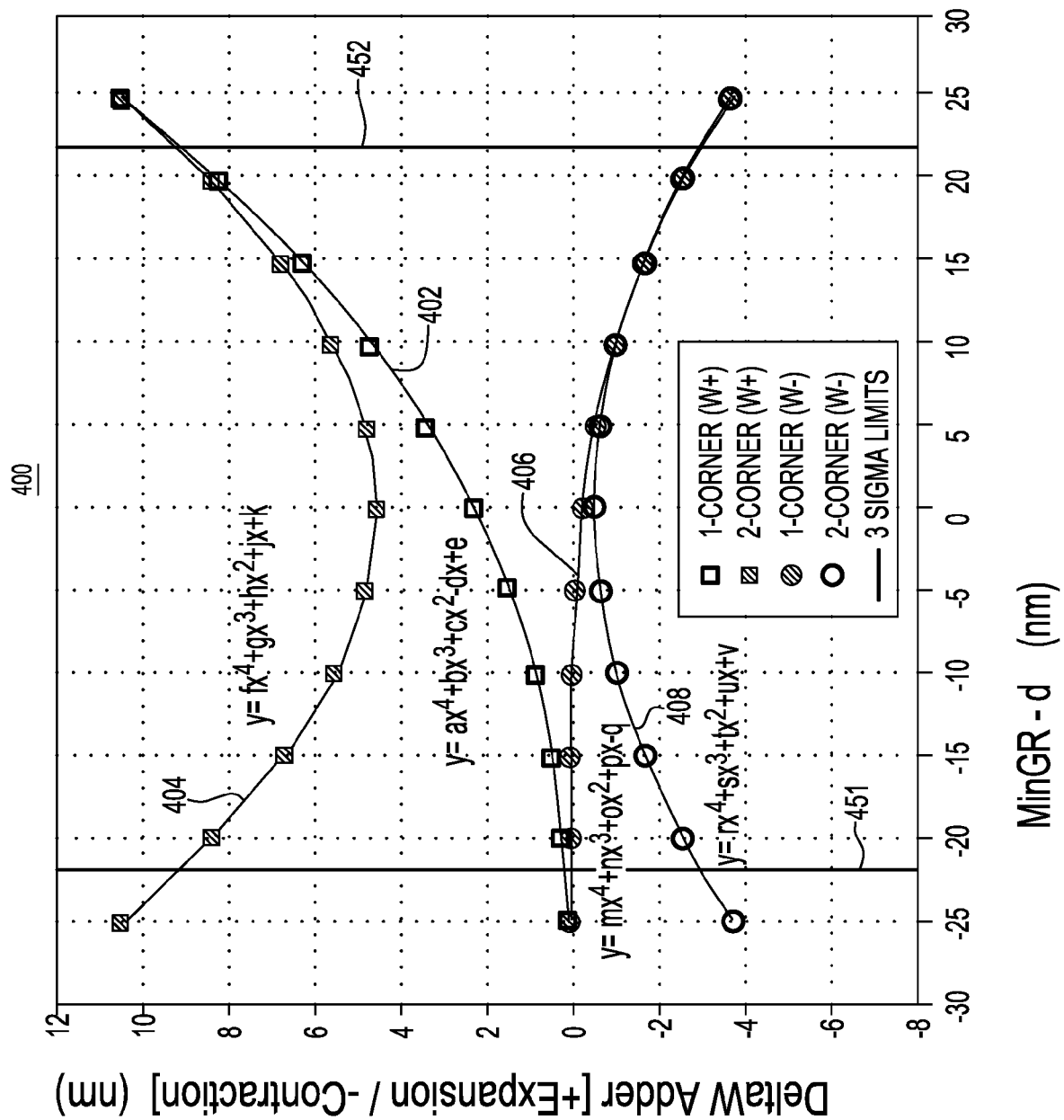

Referring to FIG. 5, there is depicted an example plot 400 of equations modeling the RX corner rounding (flare) effects for one or more example device structures such as shown in FIGS. 1A, 1B. The resulting deltaW adder example equations that model the example RX corner flare effects are generated on the basis of the extracted distances "d" embodied as the distRXEdgetoPC distances obtained in prior step 105, FIG. 2. In FIG. 5, this distance "d" is translated to a distance relating to an established minimum groundrule distance ("minGR"), according to minGR−d (=a "PC to RX space delta from groundrule") which are the values provided on the horizontal axis since a technology is interested in relative measures. Thus for example, if "d" is 90 nm and minGR=70 nm then the "PC to RX space delta from groundrule"=minGR−"d"=70−90=−20 nm. Particularly, the plot 400 of FIG. 5 is a plot of equations that model the RX expansion or contraction values and result in DeltaW adder values ("+" means expansion, "−" means contraction) as compared to a Nominal deltaW value, the points in the middle where distance minGR−d=0 (is zero), where deltaW values impacts are small, especially for width contraction. The values for the 3-sigma limits, obtained from the specification of PC to RX tolerance for the given technology (22 nm, for example), are depicted by vertical lines 451, 452 and are also incorporated into the model.

In FIG. 5, a plot of a parabola 402 which is a fourth order polynomial, e.g., $y=ax^4+bx^3+cx^2+dx+e$, is shown which represents the deltaW adder for width expansions phenomena occurring from one side of the PC and one corner of the active area (RX). Plot 402 in FIG. 5 represents the layout in FIG. 1A where the PC-RX distance 50 shown is at the minimum groundrule distance. For example, if the PC-RX distance 50 in FIG. 1A is at the groundrule distance (d=70 nm, for example), then the deltaW adder is about 2.25 nm. Further, looking at the example curve 402 depicted in FIG. 5, for the above calculated −20 nm (PC-RX space delta from groundrule=minGR−d) the actual "d"=minGR−(PC-RX space delta from groundrule)=70−(−20)=90 nm, and for this value the flare is almost zero.

Referring back to FIG. 1A, a motion of the PC to the left from the center groundrule condition by 22 nm shows in FIG. 5 that the minGR−d result was a positive 22 nm value indicating an increase in the deltaW adder of 8 nm. Moving the PC to the right by 22 nm in FIG. 1A reduces the deltaW adder to almost zero. In other words, as shown in the plot 402, the DeltaW adder value is minimally impacted as shown by the low DeltaW adder values as distance increases in the negative direction, for the single corner RX expansion case.

Plot 404 in FIG. 5 is for the case of FIG. 1B where two corners cause flaring directly on the device width. When the PC is at the middle of FIG. 1B and 52 and 54 are equal to the groundrule, the deltaW adder is 4.5 nm as seen in FIG. 5 which is double the adder if only a one-sided flare exists. The curve 404 is the sum of two flares from corners 30 and 30' (shown in FIG. 1B) and is the therefore the sum of curve 402 with its mirrored counterpart (where the mirror pivot is at value of zero on the x-axis of FIG. 5). Further, in the example depicted, a plot of a parabola 404 which is a fourth order polynomial, e.g., $y=fx^4+gx^3+hx^2+jx+k$, it is determined that a width expansion phenomena occurs from two corners, as evidenced by the increased DeltaW adder values (positive values indicating expansion).

Further, in the example depicted, a plot of a parabola 406 which is a fourth order polynomial, e.g., $y=mx^4+nx^3+ox^2+px+q$, it is determined that a width contraction phenomena occurs at a single corner, as evidenced by the decreased DeltaW adder values (negative values indicating contraction) as distance (horizontal axis) increases in the positive direction. As shown in the plot 406, the DeltaW adder value is minimally impacted as shown by the low DeltaW adder values as distance from the PC edge increases in the negative direction, for the single corner RX contraction case.

Further in the example depicted in FIG. 5, a plot of a parabola 408 which is a fourth order polynomial, e.g., $y=rx^4+sx^3+tx^2+ux+v$, it is determined that a width contraction phenomena occurs at both corners: the plot 408 indicates decreased DeltaW adder values (negative values indicating contraction) as distance horizontal axis) increases in both directions. The curve 408 is the sum of two flares from corners and is the therefore the sum of curve 406 with its mirrored counterpart (where the mirror pivot is at value of zero on the x-axis of FIG. 5).

Referring back to FIG. 2, there is depicted a next step 115 of adding the deltaW and tolerances values in the compact model and storing them in a netlist. That is, each of the deltaW and tolerances obtained from the distRXEdgetoPC distances are obtained with effects from both directions added together. Finally, in this step, netlists are populated with correct deltaW values for every transistor device.

Thus, as shown in FIG. 5, the plotting of the deltaW response for the example FET device structure (depicted in FIGS. 1A, 1B) as modeled by equations 402, 404, 406 and 408 (represented in the examples depicted in FIG. 5 as fourth order polynomial equations in the non-limiting example embodiment depicted) provides the additional RX width expansion or contraction as a function of the distance away from the corner defined by the intersection of overlying PC conductor and the active area edge. The resulting deltaW "adder" values are determined by exact equations and take into account tolerances determined from process assumptions. These values may be stored in tabular or equation form, and preferably a form that enables the values to be quickly added to the base compact model numbers using the analytical formulation.

The deltaW adder values may be easily integrated into a Compact Model flow and taken into account in the performance analysis executable by a programmed computing device. For the example lithographic features in the structures depicted in FIGS. 1A, 1B, an distRXEdgetoPC distance may be up to 100 nm in length with deltaW adder tolerances shown in FIG. 5 ranging anywhere between 0 nm and 10 nm or greater for width expansion and ranging anywhere between 0 nm and −10 nm or greater for width contraction.

The method of the present invention may be used in a circuit simulation run, such as performed by SPICE, or like simulation tool, with the circuit designer providing a description of the circuit known (netlist), with transistor models being updated as required by the updated netlist generated in accordance with the techniques of the invention. In this respect, a circuit designer may choose a model for the various circuit elements and their parameter values, and specifies the desired analysis, which determines what kind of simulation will be performed. Simulating the behavior of a MOSFET according to the invention, the netlist used in the simulation will include the deltaW and tolerances, as calculated herein, to describe the characteristics of the MOSFET. The netlist extraction is performed by a software program ("extractor") that reads information about a specific circuit. The information is typically stored in textual, graphical, tabular, or other electronic data storage formats so that the layout information that it represents can be easily modified.

It is further understood that the active semiconductor devices such as a MOSFET described in the present invention are modeled using compact models, analytic descriptions of device electrical behavior as a function of input conditions as well as device geometry and doping. A number of compact MOSFET models have been proposed, the most popular models for submicron integrated circuit applications are currently the BSIM3 and newer BSIM4 model.

The system and method of the present disclosure may be implemented and run on a general-purpose computer or computer system. The computer system may be any type of known or will be known systems and may typically include a processor, memory device, a storage device, input/output devices, internal buses, and/or a communications interface for communicating with other computer systems in conjunction with communication hardware and software, etc.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method for modeling a semiconductor transistor device structure having a conductive line feature of a designed length connected to a gate of a transistor device, said transistor including an active device (RX) area over which said gate is formed and over which said conductive line feature extends, the method comprising:
    providing, to a processor device, an analytical model representation for said transistor device structure, said analytical model representation including a function for modeling a lithographic corner rounding flare effect impacting an active device area width,
    performing an extraction to determine a distance between an edge of said conductive line feature and an RX edge portion;
    determining, from said modeling function, an effective change in active device area width (deltaW adder) as a function of said distance; and
    updating, by said processor device, transistor model parameter values in a transistor compact model for said transistor device to include deltaW adder values to be added to a built-in deltaW value, wherein a netlist used in a simulation includes the deltaW adder values to describe the characteristics of the transistor device to thereby model lithographic corner rounding effect of said active device area on transistor device parametrics.

2. The method as claimed in claim 1, wherein said providing an analytical model representation comprises: providing input data comprising a corner rounding description for modeling said RX edge portion based on said extracted distances.

3. The method as claimed in claim 2, wherein said corner rounding description for said analytical model representation defines one of: a circle or parabola.

4. The method as claimed in claim 2, wherein said corner rounding description for said analytical model representation models RX width expansion, said deltaW adder values comprising a positive number for addition to said transistor compact model for said transistor device.

5. The method as claimed in claim 2, wherein said corner rounding description for said analytical model representation models RX width contraction, said deltaW adder values comprising a negative number for addition to said transistor compact model for said transistor device.

6. The method as claimed in claim 2, wherein said function for modeling a lithographic corner rounding flare effect for said active device area (RX) width is a polynomial function.

7. The method as claimed in claim 6, wherein said polynomial function relates deltaW adder values as a function of a difference between said extracted distance and a minimum groundrule distance between said conductive line feature and an RX edge portion.

8. The method as claimed in claim 1, wherein said extraction performing step further includes: performing an extraction to determine a distance between an edge of said conductive line feature and an RX edge portion formed as a result of said lithographic flare effect impacting RX area on opposing sides of said conductive line feature, said method further including: generating a net deltaW adder value to said RX area corner rounding description for said active device area (RX) width impacted at said opposing sides.

9. A system for modeling a semiconductor transistor device structure having a conductive line feature of a designed length connected to a gate of a transistor device, said transistor including an active device (RX) area over which said gate is formed and over which said conductive line feature extends, the system comprising:
    a memory;
    a processor device in communications with the memory, wherein the system performs a method comprising:
        providing, to said processor device, an analytical model representation for said transistor device structure, said analytical model representation including a function for modeling a lithographic corner rounding flare effect impacting an active device area width,
        performing an extraction to determine a distance between an edge of said conductive line feature and an RX edge portion formed as a result of said lithographic flare effect of said active device area;
        determining, from said modeling function, an effective change in active device area width (deltaW adder) as a function of said distance; and
        updating, by said processor device, transistor model parameter values in a transistor compact model for said transistor device to include deltaW adder values to be added to a built-in deltaW value, said memory storing said updated transistor model parameter values;
    wherein a netlist used in a simulation includes the stored deltaW adder values to describe the characteristics of the transistor device to thereby model lithographic corner rounding effect of said active device area on transistor device parametrics.

10. The system as claimed in claim 9, said method further including: receiving, by said processor device, input data comprising a corner rounding description used to model said RX edge portion based on said extracted distances.

11. The system as claimed in claim 10, wherein said corner rounding description for said analytical model representation defines one of: a circle or parabola.

12. The system as claimed in claim 10, wherein said corner rounding description for said analytical model representation models RX width expansion, said deltaW adder values comprising a positive number for addition to said transistor compact model for said transistor device.

13. The system as claimed in claim 10, wherein said corner rounding description for said analytical model representation models RX width contraction, said deltaW adder values comprising a negative number for addition to said transistor compact model for said transistor device.

14. The system as claimed in claim 10, wherein said function for modeling a lithographic corner rounding flare effect for said active device area (RX) width is a polynomial function.

15. The system as claimed in claim 14, wherein said polynomial function relates deltaW adder values as a function of a difference between said extracted distance and a minimum groundrule distance between said conductive line feature and an RX edge portion.

16. The system as claimed in claim 9, wherein said performing an extraction includes determining a distance between an edge of said conductive line feature and an RX edge portion formed as a result of said lithographic flare effect impacting RX area on opposing sides of said conductive line feature, said method further including: generating a net deltaW adder value to said RX area corner rounding description for said active device area (RX) width impacted at said opposing sides.

17. A program storage device readable by a machine, tangibly embodying a program of instructions executable by the machine to perform method steps for modeling a semiconductor transistor device structure having a conductive line feature of a designed length connected to a gate of a transistor device in a circuit to be modeled, said transistor including an active device (RX) area over which said gate is formed and over which said conductive line feature extends, the method comprising the steps of:

providing, to a processor device, an analytical model representation for said transistor device structure, said analytical model representation including a function for modeling a lithographic corner rounding flare effect impacting an active device area width, performing an extraction to determine a distance between an edge of said conductive line feature and an RX edge portion formed as a result of said lithographic flare effect;

determining, from said modeling function, an effective change in active device area width (deltaW adder) as a function of said distance; and updating, by said processor device, transistor model parameter values in a transistor compact model for said transistor device to include deltaW adder values to be added to a built-in deltaW value, wherein a netlist used in a simulation includes the deltaW adder values to describe the characteristics of the transistor device to thereby model lithographic corner rounding effect of said active device area on transistor device parametrics.

18. The program storage device readable by a machine as claimed in claim 17, further including: providing, to said processor device, input data comprising a corner rounding description for modeling said RX edge portion based on said extracted distances.

19. The program storage device readable by a machine as claimed in claim 18, wherein said corner rounding description for said analytical model representation defines one of: a circle or parabola.

20. The program storage device readable by a machine as claimed in claim 18, wherein said corner rounding description for said analytical model representation models RX width expansion, said deltaW adder values comprising a positive number for addition to said transistor compact model for said transistor device.

21. The program storage device readable by a machine as claimed in claim 18, wherein said corner rounding description for said analytical model representation models RX width contraction, said deltaW adder values comprising a negative number for addition to said transistor compact model for said transistor device.

22. The program storage device readable by a machine as claimed in claim 18, wherein said function for modeling a lithographic corner rounding flare effect for said active device area (RX) width is a polynomial function.

23. The program storage device readable by a machine as claimed in claim 22, wherein said polynomial function relates deltaW adder values as a function of a difference between said extracted distance and a minimum groundrule distance between said conductive line feature and an RX edge portion.

24. The program storage device readable by a machine as claimed in claim 17, wherein said extraction performing step further includes: determining a distance between an edge of said conductive line feature and an RX edge portion formed as a result of said lithographic flare effect impacting RX area on opposing sides of said conductive line feature, said method further including: generating a net deltaW adder value to said RX area corner rounding description for said active device area (RX) width impacted at said opposing sides.

* * * * *